US012255000B2

(12) United States Patent
Sugimoto et al.

(10) Patent No.: US 12,255,000 B2
(45) Date of Patent: *Mar. 18, 2025

(54) COMPOUND SUPERCONDUCTING TWISTED WIRE AND REWINDING METHOD FOR COMPOUND SUPERCONDUCTING TWISTED WIRE

(71) Applicants: FURUKAWA ELECTRIC CO., LTD., Tokyo (JP); TOHOKU UNIVERSITY, Sendai (JP); TOKAI UNIVERSITY EDUCATIONAL SYSTEM, Tokyo (JP)

(72) Inventors: Masahiro Sugimoto, Tokyo (JP); Hirokazu Tsubouchi, Tokyo (JP); Daisuke Asami, Tokyo (JP); Hideki Ii, Tokyo (JP); Satoshi Awaji, Sendai (JP); Hidetoshi Oguro, Hiratsuka (JP)

(73) Assignees: FURUKAWA ELECTRIC CO., LTD., Tokyo (JP); TOHOKU UNIVERSITY, Sendai (JP); TOKAI UNIVERSITY EDUCATIONAL SYSTEM, Tokyo (JP)

(*) Notice: Subject to any disclaimer, the term of this patent is extended or adjusted under 35 U.S.C. 154(b) by 748 days.

This patent is subject to a terminal disclaimer.

(21) Appl. No.: 17/280,718

(22) PCT Filed: Sep. 20, 2019

(86) PCT No.: PCT/JP2019/037012
§ 371 (c)(1),
(2) Date: Mar. 26, 2021

(87) PCT Pub. No.: WO2020/066908
PCT Pub. Date: Apr. 2, 2020

(65) Prior Publication Data
US 2022/0115168 A1 Apr. 14, 2022

(30) Foreign Application Priority Data

Sep. 28, 2018 (JP) .................................. 2018-185632

(51) Int. Cl.
*H01B 12/08* (2006.01)
*C22C 9/00* (2006.01)
(Continued)

(52) U.S. Cl.
CPC ............... *H01B 12/08* (2013.01); *C22C 9/00* (2013.01); *C22C 9/02* (2013.01); *H01B 12/10* (2013.01); *H01F 6/06* (2013.01); *H01B 12/02* (2013.01)

(58) Field of Classification Search
CPC .......... H01B 12/08; H01B 12/10; C22C 9/00; C22C 9/02; H01F 6/06; H01F 41/048; H10N 60/0184; H10N 60/20; Y02E 40/60
See application file for complete search history.

(56) References Cited

U.S. PATENT DOCUMENTS 3,954,572 A * 5/1976 Ziegler ............... H10N 60/0184
205/228
4,329,539 A * 5/1982 Tanaka ................... H10N 60/80
72/286

(Continued)

FOREIGN PATENT DOCUMENTS

JP   WO 2007099820   *   7/2007
JP   WO 2013031830   *   3/2013

(Continued)

OTHER PUBLICATIONS

English (Machine) translation of WO 2013031830, Published Mar. 2013.*

(Continued)

*Primary Examiner* — Ishwarbhai B Patel
(74) *Attorney, Agent, or Firm* — Oblon, McClelland, Maier & Neustadt, L.L.P.

(57) ABSTRACT

A compound superconducting twisted wire includes compound superconducting strands being twisted to form a twisted structure, in which each of the compound superconducting strands includes a compound superconductor part, a reinforcing part and a stabilizing part. The compound superconductor part includes compound superconducting filaments and a first matrix, the compound superconducting filaments each including a compound superconducting phase. The reinforcing part is disposed on an outer circumferential side of the compound superconductor part and includes reinforcing filaments and a second matrix. The stabilizing part is disposed on at least one side of an inner circumferential side and an outer circumferential side of the reinforcing part. A volume ratio of the reinforcing part (Continued)

relative to the compound superconducting strand is larger than a volume ratio of the compound superconductor part relative to the compound superconducting strand.

17 Claims, 8 Drawing Sheets

(51) Int. Cl.
*C22C 9/02* (2006.01)
*H01B 12/10* (2006.01)
*H01F 6/06* (2006.01)
*H01B 12/02* (2006.01)

(56) References Cited

U.S. PATENT DOCUMENTS

| | | | | |
|---|---|---|---|---|
| 5,200,577 | A * | 4/1993 | Shimada | H10N 60/0128 505/887 |
| 5,364,709 | A * | 11/1994 | Yu | H10N 60/20 428/662 |
| 5,384,197 | A * | 1/1995 | Koyama | H01F 6/06 428/458 |
| 6,918,172 | B2 * | 7/2005 | Wong | C23C 2/024 505/231 |
| 12,020,830 | B2 * | 6/2024 | Sugimoto | H10N 60/0128 |
| 2015/0024943 | A1 * | 1/2015 | Sugimoto | C22F 1/08 428/656 |
| 2016/0163427 | A1 | 6/2016 | Pyon et al. | |

FOREIGN PATENT DOCUMENTS

| | | |
|---|---|---|
| JP | 5718171 B2 | 5/2015 |
| JP | 2017-517899 A | 6/2017 |
| WO | WO 2013/154187 A1 | 10/2013 |
| WO | WO 2015/138112 A1 | 9/2015 |

OTHER PUBLICATIONS

English (Machine) translation of WO 2007099820, Published Jul. 2007.*
International Search Report issued on Dec. 3, 2019 in PCT/JP2019/037012 filed on Sep. 20, 2019, 1 page.
Sugimoto, M. et al., "Development of Nb-Rod-Method Cu—Nb Reinforced Nb$_3$Sn Rutherford Cables for React-and-Wind Processed Wide-Bore High Magnetic Field Coils," IEEE Transactions on Applied Superconductivity, vol. 25, No. 3, 6000605, 2015, 5 total pages.
European Office Action issued Jul. 4, 2023 in European Patent Application No. 19865613.4, 5 pages.
Sumption et al., "Chromium Diffusion into Plated Nb3Sn Strands Deduced from Electrical Resistivity Measurement", IEEE Transactions on Applied Superconductivity, vol. 5, No. 2, Jun. 1995, pp. 1925-1928, XP011504343.
Park et al., "Status of Nb3Sn strand development in Korea", Cryogenics, vol. 48, No. 7-8, Jul. 2008, pp. 347-353, XP022819648.
Extended European Search Report issued Sep. 29, 2022 in European Patent Application No. 19865613.4, 13 pages.
Kanithi, H., et al., "Trivalent Chrome Plating for ITER Strands", IEEE Transactions on Applied Superconductivity, vol. 22, No. 3, 7800304, Jun. 2012 (Jun. 2012) (XP011446778), 4 pages.
Gregory, E., et al., "Properties of internal-tin Nb$_3$Sn Strand for the International Thermonuclear Experimental Reactor", Advances in Cryogenic Engineering, Jul. 17-21, 1995, Columbus, OH, USA, Jul. 17, 1995 (Jul. 17, 1995), pp. 1319-1328 (XP055963546).
Yu, D., et al., "Development of a Nb$_3$Sn Superconducting Strand with Co-Processed Nb Surface Coating to Limit Inter-Strand Eddy Currents in Cables", IEEE Transactions on Applied Superconductivity, vol. 5, No. 2, Jun. 1995, (Jun. 1995), pp. 1913-1916 (XP011504340).
Partial Supplementary European Search Report issued May 27, 2022 in European Patent Application No. 19865613.4, 13 pages.
Badica et al., "Performance of as-reacted and multiple bent ('prebent') practical Nb$_3$Sn bronze route wires with different architectures", Superconductor Science and Technology, vol. 20, 2007, pp. 273-280, XP020116052.

* cited by examiner

COMPOUND SUPERCONDUCTING TWISTED WIRE AND REWINDING METHOD FOR COMPOUND SUPERCONDUCTING TWISTED WIRE

TECHNICAL FIELD

The present invention relates to a compound superconducting twisted wire (a compound superconducting cable) and a rewinding method thereof, in particular, to a compound superconducting twisted wire suitable for use in a superconducting coil, etc. wound by a react-and-wind process.

BACKGROUND ART

As described in, for example, Patent Document 1 and Non-Patent Document 1, conventional compound superconducting twisted wire may be produced by a so-called react-and-wind process, in which a plurality of wires including a reinforcing material such as Cu—Nb are twisted to form a twisted wire, the twisted wire is subjected to heat treatment, then a pre-bending strain is applied to the twisted wire, and then the twisted wire is wound to form a superconducting coil. It is known that this process improves a critical current of the compound superconducting twisted wire which constitutes the superconducting coil.

However, the compound superconducting twisted wire produced by conventional art as described above cannot be said to have a sufficient strength against tension, and there is a need to further enhance the strength.

Additionally, conventional compound superconducting twisted wire generally has a low cross section compression ratio (for example, about 4% when the twisted wire is a rectangular Rutherford cable) and therefore an electric current density cannot be sufficiently enhanced.

Meanwhile, if the cross section compression ratio is increased to enhance the electric current density, strands are likely to partially adhere to each other due to thermal fusion during heat treatment. If the strands are adhered to each other, it is not possible to apply a uniform bending strain to each of all the strands constituting the twisted wire during repeated application of pre-bending strains. Therefore, some strands may be easily subject to a large strain (or stress) in a compound superconductor part, resulting in damage.

Patent Document 1: Japanese Patent No. 5718171

Non-Patent Document 1: M. Sugimoto et. al., Development of Nb-Rod-Method Cu—Nb Reinforced $Nb_3Sn$ Rutherford Cables for React-and-Wind Processed Wide-Bore High Magnetic Field Coils, IEEE Trans. Appl. Super., IEEE, 2015, Vol. 25, No. 3, p. 6000605

DISCLOSURE OF THE INVENTION

Problems to be Solved by the Invention

The present invention is premised to produce electromagnet (superconducting coil) including a compound superconducting twisted wire, in particular, by the react-and-wind process. An object of the present invention is to provide a compound superconducting twisted wire in which non-adhesiveness between compound superconducting strands or separation easiness after adhesion is remarkably improved, while a strength against tension (in particular, 0.2% proof stress) is improved to a degree to be equivalent to or stronger than that of a conventional compound superconducting twisted wire, by controlling the compound superconducting strands constituting the twisted wire. Such compound superconducting twisted wire enables a superconducting coil to be commercially produced. An additional object of the present invention is to provide a rewinding method thereof.

Means for Solving the Problems

The gist of the configuration of the present invention is as follows:

A first aspect of the present invention relates to a compound superconducting twisted wire including a plurality of compound superconducting strands being twisted to form a twisted structure, in which each of the compound superconducting strands includes a core-like compound superconductor part, a cylindrical reinforcing part and a cylindrical stabilizing part, in which the core-like compound superconductor part includes a plurality of compound superconducting filaments and a first matrix, the compound superconducting filaments each including a compound superconducting phase, the first matrix including the plurality of compound superconducting filaments embedded therein and a first stabilizing material, in which the cylindrical reinforcing part is disposed on an outer circumferential side of the compound superconductor part, and includes a plurality of reinforcing filaments and a second matrix, the second matrix including the plurality of reinforcing filaments embedded therein and a second stabilizing material, in which the cylindrical stabilizing part is disposed on at least one side of an inner circumferential side and an outer circumferential side of the reinforcing part, and includes a third stabilizing material, and in which a volume ratio of the reinforcing part relative to the compound superconducting strand is larger than a volume ratio of the compound superconductor part relative to the compound superconducting strand.

A second aspect of the present invention relates to the compound superconducting twisted wire as described in the first aspect, in which the volume ratio of the reinforcing part relative to the compound superconducting strand is 40% or more and 65% or less and the volume ratio of the compound superconductor part relative to the compound superconducting strand is 20% or more and 40% or less.

A third aspect of the present invention relates to the compound superconducting twisted wire as described in the first or second aspect, in which at least one or all of the plurality of compound superconducting strands have a surface scar generated when the compound superconducting strands have been separated from an adhering surface of other compound superconducting strands.

A fourth aspect of the present invention relates to a compound superconducting twisted wire including a plurality of compound superconducting strands being twisted to form a twisted structure, in which each of the compound superconducting strands includes a core-like compound superconductor part, a cylindrical reinforcing part and a cylindrical stabilizing part, in which the core-like compound superconductor part includes a plurality of compound superconducting filaments and a first matrix, the compound superconducting filaments each including a compound superconducting phase, the first matrix including the plurality of compound superconducting filaments embedded therein and a first stabilizing material, in which the cylindrical reinforcing part is disposed on an outer circumferential side of the compound superconductor part, and includes a plurality of reinforcing filaments and a second matrix, the second matrix including the plurality of reinforcing filaments embedded therein and a second stabilizing material, in which the cylindrical stabilizing part is disposed on at least one side of an inner circumferential side and an outer circumferential side of the reinforcing part, and includes a third stabilizing material, and in which the compound superconducting twisted wire includes a metal layer with a thickness of 2 μm or less on a surface of the compound superconducting strand for preventing thermal fusion between the compound superconducting strands.

A fifth aspect of the present invention relates to the compound superconducting twisted wire as described in the fourth aspect, in which the metal layer has a thickness of 1 μm or less.

A sixth aspect of the present invention relates to the compound superconducting twisted wire as described in any one of the first to fifth aspects, further including an Sn diffusion prevention part between the compound superconductor part and the reinforcing part.

A seventh aspect of the present invention relates to the compound superconducting twisted wire as described in the sixth aspect, in which the compound superconducting phase includes $Nb_3Sn$, the first stabilizing material includes Cu or a Cu alloy, the Sn diffusion prevention part includes Nb or Ta, or an alloy or a composite thereof, the reinforcing filament includes at least one metal or an alloy of two or more metals selected from the group consisting of Nb, Ta, V, W, Mo, Fe, Ti, Ag, and Hf, the second stabilizing material includes Cu or a Cu alloy, and the third stabilizing material includes Cu or a Cu alloy.

An eighth aspect of the present invention relates to the compound superconducting twisted wire as described in any one of the first to seventh aspects, in which a total of a volume ratio of the second stabilizing material relative to the compound superconducting strand and a volume ratio of the third stabilizing material relative to the compound superconducting strand is 50% or more.

A ninth aspect of the present invention relates to the compound superconducting twisted wire as described in the sixth aspect, in which a total of a volume ratio of the reinforcing filament relative to the compound superconducting strand and a volume ratio of the Sn diffusion prevention part relative to the compound superconducting strand is 15% or more.

A tenth aspect of the present invention relates to the compound superconducting twisted wire as described in any one of the first to ninth aspects, in which a volume ratio of the reinforcing filament constituting the reinforcing part relative to the compound superconducting strand is 11% or more and 15% or less.

An eleventh aspect of the present invention relates to the compound superconducting twisted wire as described in any one of the first to tenth aspects, in which the twisted structure has a substantially rectangular cross section shape.

A twelfth aspect of the present invention relates to the compound superconducting twisted wire as described in the eleventh aspect, further including a metal tape for preventing thermal fusion between the compound superconducting strands, in which the metal tape is disposed between the compound superconducting strands constituting the compound superconducting twisted wire.

A thirteenth aspect of the present invention relates to the compound superconducting twisted wire as described in the eleventh or twelfth aspect, in which the twisted structure has a cross section compression ratio of 5% or more and 20% or less.

A fourteenth aspect of the present invention relates to a method for rewinding the compound superconducting twisted wire as described in any one of the first to thirteenth aspects, from a first winding member to a second winding member, including: winding off the compound superconducting twisted wire from the first winding member in a tangential direction of the first winding member; and winding the compound superconducting twisted wire around the second winding member, while bending the compound superconducting twisted wire in the same direction as the direction in which the compound superconducting twisted wire was wound around the first winding member.

Effects of the Invention

The compound superconducting twisted wire of the present invention adopts a configuration including a plurality of compound superconducting strands being twisted to form a twisted structure, in which each of the compound superconducting strands includes a core-like compound superconductor part, a cylindrical reinforcing part and a cylindrical stabilizing part, in which the core-like compound superconductor part includes a plurality of compound superconducting filaments and a first matrix, the compound superconducting filaments each including a compound superconducting phase, the first matrix including the plurality of compound superconducting filaments embedded therein and a first stabilizing material, in which the cylindrical reinforcing part is disposed on an outer circumferential side of the compound superconductor part, and includes a plurality of reinforcing filaments and a second matrix, the second matrix including the plurality of reinforcing filaments embedded therein and a second stabilizing material, in which the cylindrical stabilizing part is disposed on at least one side of an inner circumferential side and an outer circumferential side of the reinforcing part, and includes a third stabilizing material, and in which a volume ratio of the reinforcing part relative to the compound superconducting strands is larger than a volume ratio of the compound superconductor part relative to the compound superconducting strands or the compound superconducting twisted wire includes a metal layer with a thickness of 2 μm or less on a surface of the compound superconducting strand for preventing thermal fusion between the compound superconducting strands. Thereby, it is possible to provide the compound superconducting twisted wire that has remarkably improved non-adhesiveness between compound superconducting strands or separation easiness after adhesion, while a strength against tension (in particular, 0.2% proof stress) is improved to a degree to be equivalent to or stronger than that of a conventional compound superconducting twisted wire. The compound superconducting twisted wire enables a superconducting coil to be commercially produced.

PREFERRED MODE FOR CARRYING OUT THE INVENTION

Subsequently, preferable embodiments of the compound superconducting twisted wire according to the present invention are explained in detail below.

[Compound Superconducting Twisted Wire]

Figure 1:
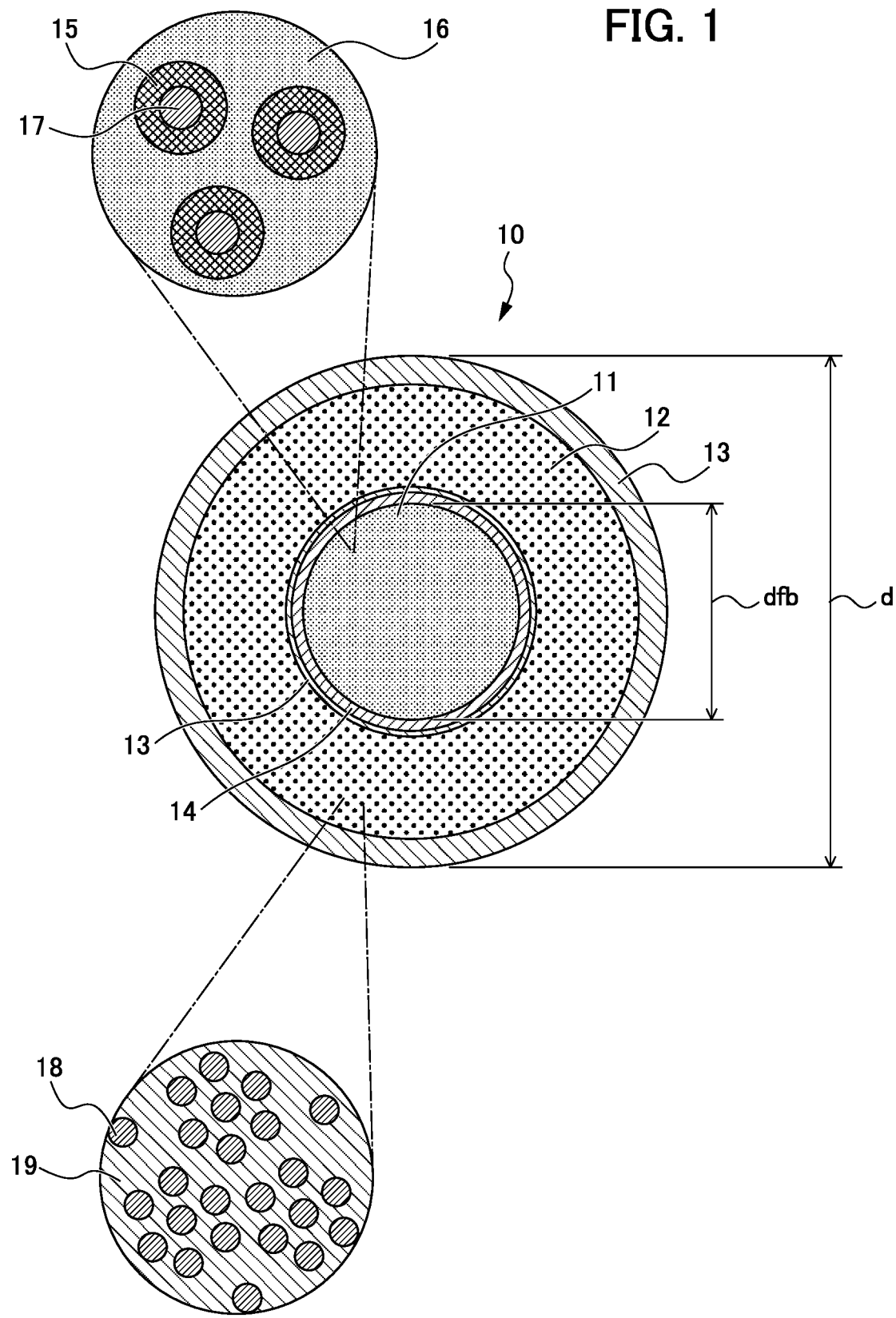
FIG. 1 is a schematic diagram illustrating a cross section of one of a plurality of compound superconducting strands constituting the compound superconducting twisted wire according to an embodiment of the present invention, showing a state before compression.

FIG. 1 is a schematic diagram illustrating a cross section of a compound superconducting strand 10, taken out from the plurality of compound superconducting strands constituting the compound superconducting twisted wire before compression according to an embodiment of the present invention. FIGS. 4(a) and 4(b) are schematic diagrams illustrating cross sections of compound superconducting twisted wires according to an embodiment of the present invention, FIG. 4(a) illustrates a state of the compound superconducting twisted wire 1 before compression and FIG. 4(b) illustrates a state of the compound superconducting twisted wire 1A after compression with a cross section compression ratio of 6%.

The compound superconducting twisted wire 1 of the embodiment shown in FIG. 4(a) is formed as a twisted structure in which a plurality of compound superconducting strands 10 is twisted together. In FIG. 4(b), two tiers each including eight compound superconducting strands 10 arranged in parallel are stacked, so that a total of 16 compound superconducting strands are twisted together to form the twisted structure. These twisted structures have a substantially rectangular cross section shapes, and a case in which the compound superconducting twisted wire 1 is formed as a so-called rectangular Rutherford cable is indicated.

<Compound Superconducting Strand>

The compound superconducting strand 10 mainly includes a compound superconductor part 11, a reinforcing part 12, and a stabilizing part 13.

(Compound Superconductor Part)

The compound superconductor part 11 includes a plurality of compound superconducting filaments 15 each including a compound superconducting phase, and a first matrix 16 in which the plurality of compound superconducting filaments 15 is embedded. The first matrix 16 includes a first stabilizing material. The compound superconductor part 11 forms a core-like shape as a whole.

The compound superconducting phase is preferably a metal compound superconducting phase including $Nb_3Sn$ (niobium-tin), but is not limited thereto, and may be other compound superconducting phases, for example, including $Nb_3Al$ (niobium-aluminum) or having superconductive property.

The first stabilizing material constituting the first matrix 16 is preferably copper (Cu) or a copper alloy. By disposing the first matrix 16, it is possible to achieve an effect of suppressing damage to the compound superconductive filament 15, and of providing magnetic stabilization and thermal stabilization of the compound superconducting strand 10.

Note that FIG. 1 shows the compound superconductor part 11 produced by a so-called bronze process, in which a plurality of Nb filaments are embedded in a first matrix precursor (first matrix before heat treatment) of Cu—Sn (copper-tin)-base alloy, which is the first stabilizing material, the embedded Nb filaments are subjected to drawing processing, etc. to form a compound superconducting precursor strand; the compound superconducting precursor strand is subjected to heat treatment; this diffuses Sn in the first matrix precursor and allows the Sn to react with surfaces of Nb filaments; and thereby an $Nb_3Sn$ filament is formed from the Nb filament. The enlarged view of the compound superconductor part 11 shown in FIG. 1 indicates a case in which a core portion 17 of unreacted Nb remaining without reacting with Sn exists. However, with respect to the compound superconductor part 11, it is possible to produce the compound superconducting filament 15 after heat treatment as a filament in which the core portion 17 of unreacted Nb does not exist and all of which consists of $Nb_3Sn$, depending on the amount of Sn contained in the first matrix precursor and a diameter size of the Nb filament before heat treatment.

Further, although Cu—Sn base alloy of the first matrix precursor can contain 15.8 mass % of Sn at the maximum (solid solution limit), a Sn content in the Cu—Sn base alloy which constitutes the first matrix 16 after the heat treatment is typically reduced to about 1 to 2 mass % depending on the heat treatment conditions, as a result of using Sn for the formation of a $Nb_3Sn$ filament 15. Therefore, the Cu—Sn base alloy constituting the first matrix 16 can have a function corresponding to the stabilizing material substantially consisted of Cu.

In addition, the Cu—Sn (copper-tin) base alloy, which is the first stabilizing material, may contain elements other than Cu and Sn, but only in small amounts, and the Cu—Sn base alloy preferably contains, for example, Ti or the like in a range of 0.2 to 0.3 mass %.

(Reinforcing Part)

The reinforcing part 12 includes a plurality of reinforcing filaments 18 and a second matrix 19 including a second stabilizing material, is disposed on the outer circumferential side of the compound superconductor part 11, and has a cylindrical shape as a whole. Further, the reinforcing part 12 is obtained by embedding a plurality of reinforcing filaments 18 in the second matrix 19.

As illustrated in FIG. 1, in the compound superconducting strand 10 used in the compound superconducting twisted wire 1 of an embodiment shown in FIG. 4(b), a volume ratio of the reinforcing part 12 relative to the compound superconducting strand 10 is larger than a volume ratio of the compound superconductor part 11 relative to the compound superconducting strand 10. The reason why this configuration is adopted is as follows:

Generally, when heat treatment is applied to a twisted wire, thermal fusion is likely to occur between strands constituting the twisted wire. In order to miniaturize the twisted wire, when each of the strands is compressed from the outside and then is subjected to heat treatment, this fused state tends to remarkably easily occur as the cross section compression ratio is increased. If the twisted wire with such fused state is bent, a center of bending is at the center of the entirety of the twisted wire. Therefore, in the strands integrated at a fusion portion, a strand positioned in an outer side of the bending is subject to a larger tensile stress, whereas a strand positioned in an inner side is subject to a larger compression stress. Thus, different strands are subject to different stresses. Therefore, a circumstance in which breakage easily occurs is generated, depending upon strands. As a result, there is a problem for bending property as a twisted wire.

Therefore, in the compound superconducting twisted wire 1 of the present embodiment, the volume ratio of the reinforcing part 12 relative to the compound superconducting strand 10 is larger than the volume ratio of the compound superconductor part 11 relative to the compound superconducting strand 10. Thereby, as the strength of each strand 10 under tension is increased, the bending stiffness is improved. Thus, even when fusion (adhesion) occurs between strands 10, repulsion of the respective strands against bending of the entire twisted wire is increased, and this results in easy separation (peeling off) of the fusion portion. As a result, due to bending of the twisted wire, all of the strands constituting the twisted wire come to be bent at a neutral axis of bending of the respective strands. Thus, breakage of strands due to integration of fusion is less likely to occur, and this improves bending property as the entire twisted wire, and the strength under tension (for example, 0.2% proof stress) can be enhanced.

The volume ratio of the reinforcing part relative to the compound superconducting strand is preferably 40% or more and 65% or less. The reason for this is as follows: when the volume ratio of the reinforcing part is less than 40%, a strength under tension of the respective strands 10 may not be sufficiently increased, and therefore, when fusion (adhesion) occurs between the strands 10, the fusion portion may not be easily separated (peeled off); when the volume ratio of the reinforcing part is larger than 65%, the volume ratio of the compound superconductor part is too small, and therefore superconductive property may not be sufficiently ensured.

The volume ratio of the compound superconductor part relative the compound superconducting strand is preferably 20% or more and 40% or less. When the volume ratio of the compound superconductor part relative to the compound superconducting strand is less than 20%, the volume ratio of the compound superconductor part is too small, and therefore superconductive property may not be sufficiently ensured. When the volume ratio of the compound superconductor part is larger than 40%, the volume ratio of the reinforcing part 12 is too small, and therefore a strength under tension of the strand 10 cannot be sufficiently increased. There is a possibility that when fusion (adhesion) occurs between the strands 10, the fusion portion may not be easily separated (peeled).

Further, at least one or all of the compound superconducting strands 10 of the compound superconducting twisted wire 1 in the present embodiment may have a surface scar generated when the compound superconducting strands have been separated from an adhering surface of other compound superconducting strands. Thereby, at least upper and lower strands are separated (peeled off) from each other after thermal fusion (adhesion), and consequently, when bending is applied to the entirety of the twisted wire, the respective strands can be bent at the neutral axis of bending of the respective strands. This improves bending property of the twisted wire as a whole and also enhances the strength under tension (for example, 0.2% proof stress). It should be noted that it is possible to determine whether or not the surface scar was generated after separation (peeling off) of thermal fusion (adhesion) of the strands by observing the surface of the strands by visual inspection or observation using a magnifying glass with a magnifying power of 5 times to 20 times.

It is preferable that the reinforcing filament 18 is formed by mainly containing at least one metal or an alloy of two or more metals selected from the group consisting of Nb, Ta, V, W, Mo, Fe, Ti, Ag, and Hf. Herein, it should be noted that the reinforcing filament 18 "mainly contains" refers to the point that unavoidable impurities may be contained therein.

For example, the reinforcing filament 18 which mainly contains Nb may contain some unavoidable impurities including O: 150 ppm or less, H: 15 ppm or less, C: 100 ppm or less, N: 100 ppm or less, Fe: 50 ppm or less, Ni: 50 ppm or less, Ti: 20 ppm or less, Si: 50 ppm or less, W: 300 ppm or less, and Ta: 1,000 ppm or less. Further, the reinforcing filament 18 which mainly contains Ta may contain some unavoidable impurities including O, H, C, N, Fe, Ni, Ti, Si, W, Nb, and Mo.

Since these metals or alloys constituting the reinforcing filament 18 do not easily dissolve in Cu as a solid during the heat treatment of compound superconductor generation, a compound with Cu is unlikely to be easily formed. Therefore, these metals or alloys effectively contribute to improvement in bending strain properties. It should be noted that in the embodiment of the present invention, as a material constituting the reinforcing filament 18, Nb, Ta, V, W, Mo and Hf which do not exhibit ferromagnetism are preferred, considering an effect on the compound superconducting twisted wire 1, and further, Nb, Ta or V is preferred from the viewpoint of workability.

Further, as the alloy including two or more metals selected from the above-described group, an Nb—Ta alloy is preferred in the point of excellency in composite workability with copper or a copper alloy. As an alloy including a metal selected from the group and copper, a Cu—Nb alloy or a Cu—V alloy is preferred in the point of excellency in composite workability with copper or a copper alloy.

It should be noted that the description "not easily dissolve in Cu" as described above refers to the point that a metal or an alloy constituting the reinforcing filament 18 dissolves in Cu as a solid in a content of less than 1 at. % at a temperature during the heat treatment (e.g., 600° C. to 750° C.) to form the compound superconducting phase.

As described above, by adopting a configuration of the reinforcing part 12 in which a plurality of the reinforcing filaments 18 mainly containing a metallic material which does not easily dissolve in Cu as a solid are embedded in the second matrix 19, it is possible to suppress the formation (existence) of an intermetallic compound in the reinforcing filament 18 in the reinforcing part 12, and thereby to form a reinforcing member having high strength against tensile strain and bending strain.

The volume ratio of the reinforcing filament relative to the compound superconducting strand is preferably 11% or more and 15% or less, and more preferably 12% or more and 14% or less. When the volume ratio is less than 11%, an increase in the strength under tension or improvement in the bending stiffness is insufficient. Even when fusion (adhesion) occurs between the strands, repulsion of the respective strands against bending of the entirety of the twisted wire is insufficient. Thus, a problem that easy separation (peeling off) of the fusion portion is not possible may arise. When the volume ratio is more than 15%, due to a large cross section compression ratio applied to strands in twisted wire molding processing, repulsion of the respective strands is too strong and a local variation of compression load is caused, resulting in a problem in the finished shape of the molded twisted wire.

It is preferable that the second stabilizing material constituting the second matrix 19 mainly contains copper or a copper alloy. It should be noted that second stabilizing material "mainly contains" refers to the point that unavoidable impurities may be contained therein. Herein, the unavoidable impurities include O, Fe, S and Bi. By disposing the second stabilizing material, it is possible to achieve effects that the reinforcing part 12 can have not only a strengthening function but also a stabilizing function.

(Stabilizing Part)

The stabilizing part 13 is disposed on at least one side of the inner circumferential side and the outer circumferential side of the reinforcing part 12. In FIG. 1, the stabilizing parts 13 are disposed on both the inner circumferential side and the outer circumferential side of the reinforcing part 12. The stabilizing part 13 includes a third stabilizing material and forms a cylindrical shape as a whole. By disposing the stabilizing part 13, it is possible to suppress abnormal deformation during processing of the reinforcing part 12 and to provide a stabilizing function.

It is preferable that the third stabilizing material mainly contains copper or a copper alloy. It should be noted that "mainly contains" in the third stabilizing material refers to the point that unavoidable impurities may be contained. Herein, the unavoidable impurities include O, Fe, S and Bi.

Further, it is preferable that the total of the volume ratio (%) of the second stabilizing material constituting the reinforcing part 12 relative to the compound superconducting strand 10 and the volume ratio of the third stabilizing material constituting the stabilizing part 13 relative to the compound superconducting strand 10 is 50% or more. By setting the total of the volume ratio of the second stabilizing material in the reinforcing part 12 and the volume ratio of the third stabilizing material constituting the stabilizing part 13, which are disposed on the outer side of the compound superconductor part 11, to 50% or more, it is possible to suppress a decrease in a residual resistance ratio and to decrease a resistivity at cryogenic temperatures when the twisted wire is used.

In the compound superconducting twisted wire 1 of the present invention, the first stabilizing material constituting the compound superconductor part 11, the second stabilizing material constituting the reinforcing part 12, and the third stabilizing material constituting the stabilizing part 13 are used, herein the "stabilizing material" refers to a material, generally a metal, which is electrically and/or thermally in contact with a superconductor so as to ensure thermal contact with a refrigerant and/or act as an electric shunt circuit, as defined in JIS H 7005: 2005. The stabilizing material refers to normal conducting metal material that is complexed to a superconductor to enhance stability of the superconductor. Specifically, normal conducting metals such as copper and aluminum have good thermal conductivity and low specific resistance at cryogenic temperatures, so that when used as a matrix for a superconducting wire, electric current flows through these normal conducting metals as bypass even if there is transition from the superconducting state to the normal conducting state. Thus, heat generation is suppressed, and the generated heat is rapidly propagated and diffused, and then it is cooled. Furthermore, normal conducting metals such as copper and aluminum, which dump external magnetic flux variation and do not directly transmit magnetic flux variation to the superconductor, are widely used as the stabilizing material for the superconducting wires.

(Metal Layer)

Figure 2:
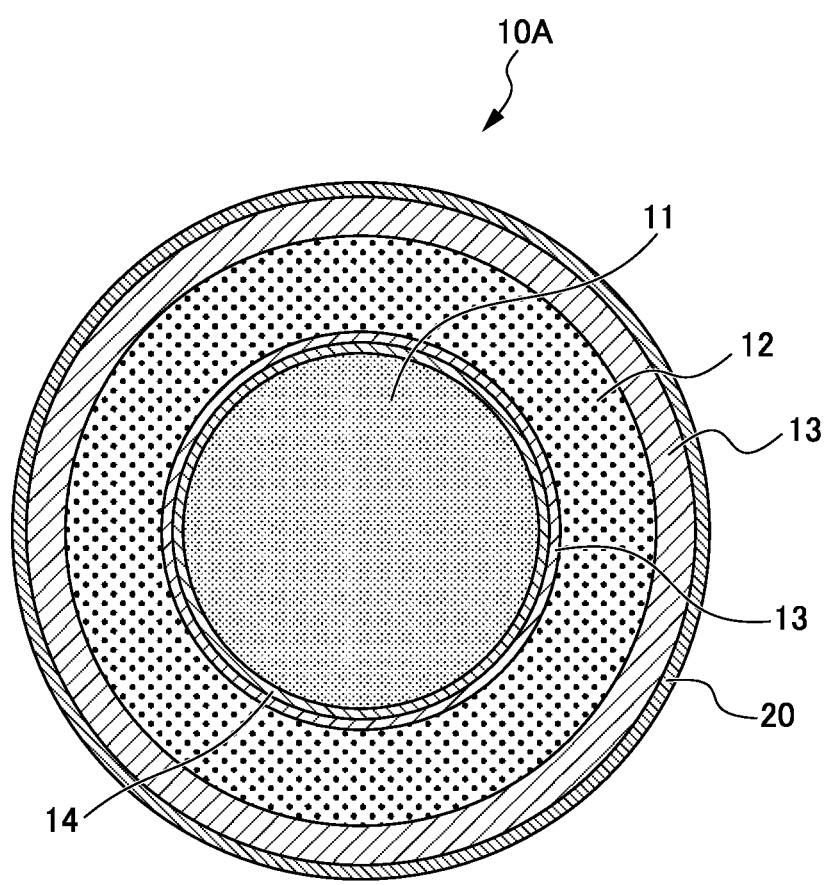
FIG. 2 is a schematic diagram illustrating a cross section of one of a plurality of compound superconducting strands constituting the compound superconducting twisted wire according to another embodiment of the present invention, showing a state before compression.

FIG. 2 is a diagram illustrating the compound superconducting strand 10A used for constituting the compound superconducting twisted wire (not shown) of another embodiment. The compound superconducting twisted wire of this embodiment is formed using the compound superconducting strand 10A shown in FIG. 2, instead of the compound superconducting strand 10. In the compound superconducting twisted wire of this embodiment, the compound superconducting strand 10A has a metal layer 20 with a thickness of 2 μm or less on the surface to prevent thermal fusion between the compound superconducting strands. By forming a metal layer on the surface of strands, it is possible to prevent the strands constituting the twisted wire from thermally fusing to each other even when the twisted wire is subjected to heat treatment. Even when bending is applied to the twisted wire, the strands are separate from each other, and as a result, the respective strands can be bent at the neutral axis of bending, preventing the strands from being broken. Thereby, the bending property of the twisted wire can be improved.

The metal layer 20 can be produced not only by a wet plating method such as an electroplating method or an electroless plating method, but also by a dry plating method such as a chemical vapor deposition method or a physical vapor deposition method. As the metal constituting the metal layer, examples include a metal such as chromium (Cr), nickel (Ni) and a copper alloy such as Cu—Ni, Cu—Si, and Cu—Zn. In particular, it is preferable to form a metal layer by Cr plating, because of excellent non-adhesiveness and abrasion resistance. It should be noted that the thickness of the metal layer 20 is preferably 1 μm or less, and more preferably 0.5 μm or less. By setting the thickness of the metal layer to 1 μm or less, it is possible to suppress a diffusing amount of a component of the metal layer (for example, chromium (Cr), which is an impurity to the stabilizing material, when performing a heat treatment for forming a compound superconducting phase (for example, $Nb_3Sn$) while maintaining a function to prevent fusion between strands after the heat treatment. As a result, it is possible to suppress decrease in a residual resistance ratio and decrease resistivity at cryogenic temperatures at which the twisted wire is used. Additionally, the lower limit of the metal layer is preferably 0.2 μm or more, from the viewpoint of avoiding generation of a non-plated site in which no metal layer exists.

(Optional Component of Compound Superconducting Strand)

The compound superconducting strand 10 constituting the compound superconducting twisted wire 1 of the present invention includes, as essential components, the compound superconductor part 11, the reinforcing part 12 with a specific volume ratio, and the stabilizing part 13; or includes, as essential components, the compound superconductor part 11, the reinforcing part 12, the stabilizing part 13, and the metal layer 20. The compound superconducting strand 10 may have a further different component.

For example, it is possible to dispose an Sn diffusion prevention part 14 between the compound superconductor part 11 and the reinforcing part 12.

The Sn diffusion prevention part 14 preferably includes Nb or Ta or an alloy or composite thereof. The Sn diffusion prevention part 14 has a function of preventing Sn in a Cu—Sn base alloy, which constitutes the first matrix 16 to form the $Nb_3Sb$ filament in the compound superconductor part 11, from diffusing into the reinforcing part 12 and the stabilizing part 13, and thereby not only suppressing decrease in the residual resistance ratio of the second and third stabilizing materials, which constitute the reinforcing part 12 and the stabilizing part 13, but also retaining in the Cu—Sn base alloy an Sn quantity required to react with the Nb filament to form $Nb_3Sn$.

Figure 3:
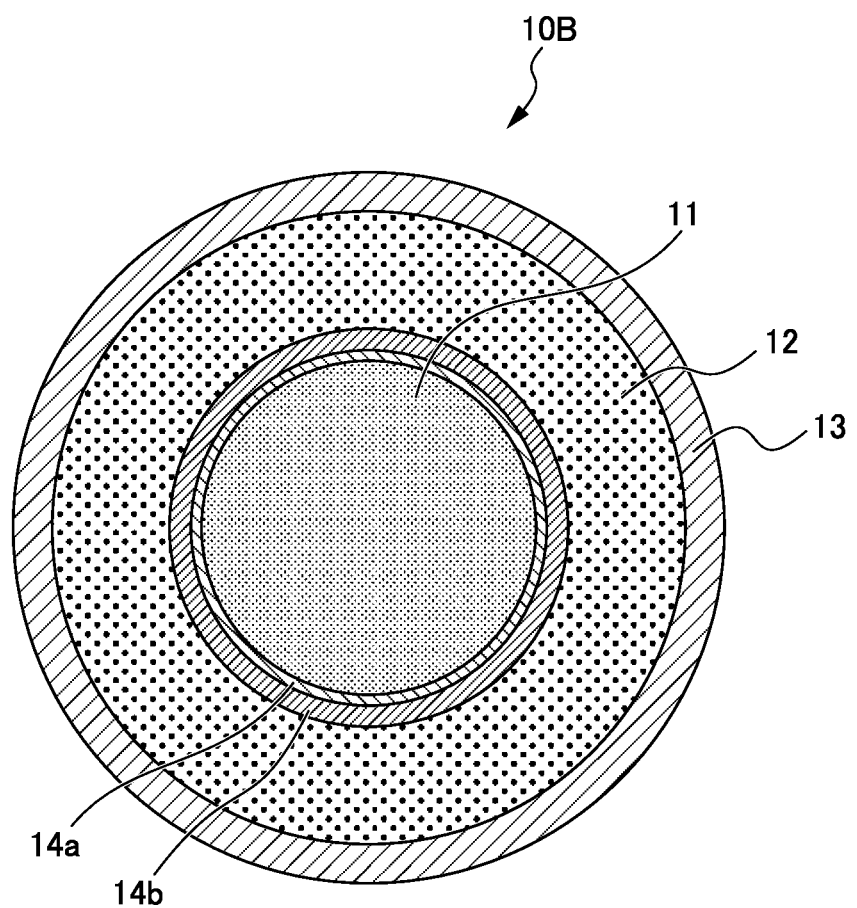
FIG. 3 is a schematic diagram illustrating a cross section of one of a plurality of compound superconducting strands constituting the compound superconducting twisted wire according to another embodiment of the present invention, showing a state before compression.

It should be noted that although FIG. 1 is a diagram illustrating an embodiment of the compound superconducting strand 10 in which the Sn diffusion prevention part 14 in one layer is disposed between the compound superconductor part 11 and the reinforcing part 12, two more layers of Sn diffusion prevention parts 14a and 14b may be disposed. FIG. 3 is a drawing illustrating a compound superconducting strand 10B in which two layers of the Sn diffusion prevention parts 14a and 14b are disposed.

A total of a volume ratio of the reinforcing filament 18 constituting the reinforcing part 12 relative to the compound superconducting strand 10 and a volume ratio of the Sn diffusion prevention part 14 relative to the compound superconducting strand 10 is preferably 15% or more. By setting the total of the volume ratio of the reinforcing filament 18 in the reinforcing part 12 and the volume ratio of the Sn diffusion barrier part 14 to 15% or more, a strength mainly in the outer side of the compound superconductor part 11 is increased in each of the strands. Thereby, bending stiffness is increased and it becomes easier to peel off the fusion portion when the twisted wire is bent. As a result, the bending property of the twisted wire can be improved as a whole. Further, when it is necessary to further improve separation easiness after thermal fusion (adhesion) between the strands, it is preferable that the total of the volume ratio of the reinforcing filament 18 constituting the reinforcing part 12 relative to the compound superconducting strand 10 and the volume ratio of the Sn diffusion prevention part 14 relative to the compound superconducting strand 10 is 16% or more and 23% or less. It should be noted that the upper limit of the total of the volume ratios is preferably 25% or less, from the viewpoint of avoiding the volume ratio of the compound superconductor part 11 becoming too small to ensure a critical current value of the compound superconducting strand 10.

Further, the total of the volume ratio of the compound superconductor part 11 and the volume ratio of the Sn diffusion prevention layer 14 is preferably 20% or more, and more preferably 30% or more. When the total of the volume ratios is 20% or more, it is possible to obtain a practical critical current value of the superconducting twisted wire obtained by using the react-and-wind process.

[Other Embodiments of Compound Superconducting Twisted Wire]

Figure 4:
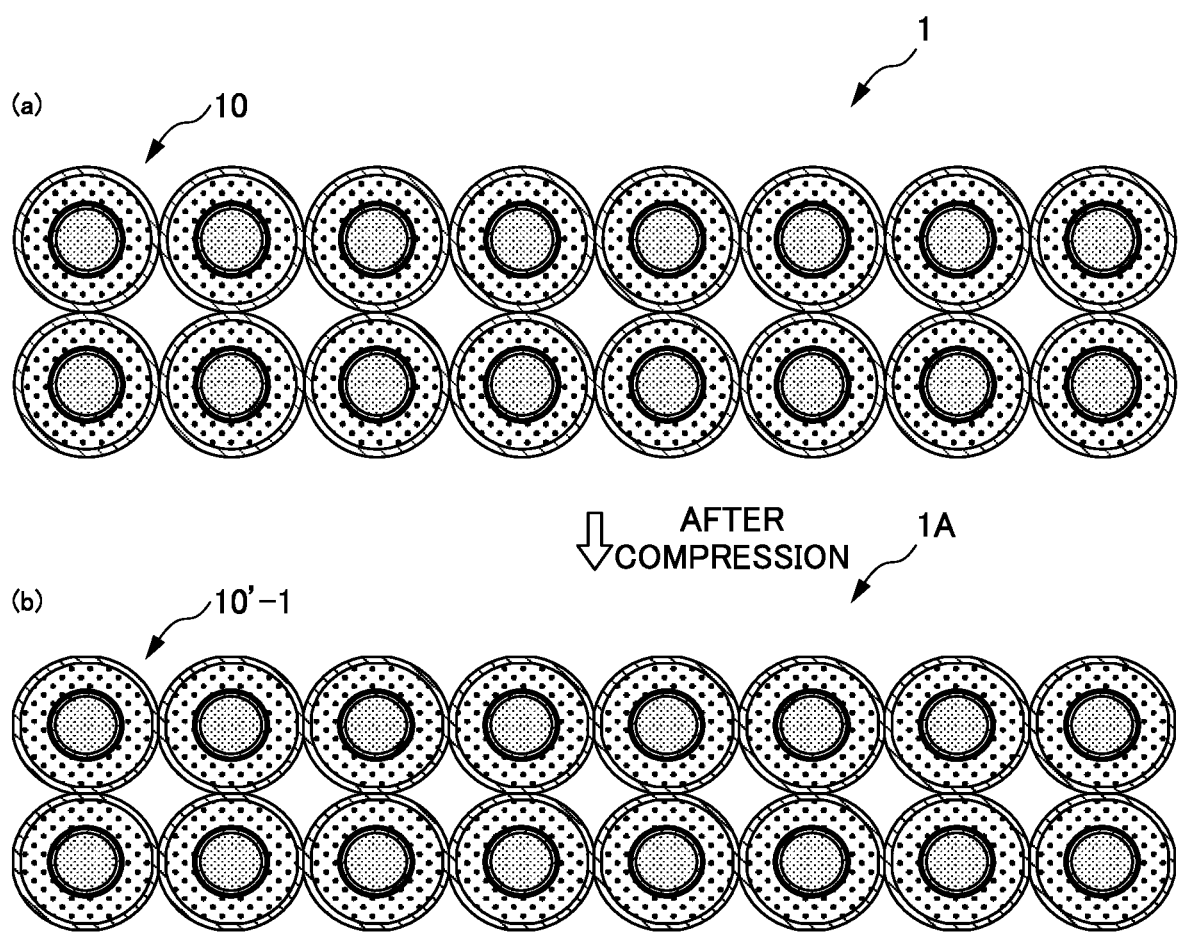
FIGS. 4(a) and 4(b) are schematic diagrams illustrating cross sections of compound superconducting twisted wires according to an embodiment of the present invention, FIG. 4(a) showing a state of a cross section of the twisted wire before compression and FIG. 4(b) showing a state of a cross section of the twisted wire after compression with a cross section compression ratio of 6% (Example 1)

As another embodiment, the compound superconducting twisted wire 1 may have a substantially rectangular cross section shape as shown in FIG. 4 (b), which is formed as a so-called rectangular Rutherford twisted wire (cable), or may have a round cross section shape.

Figure 6:
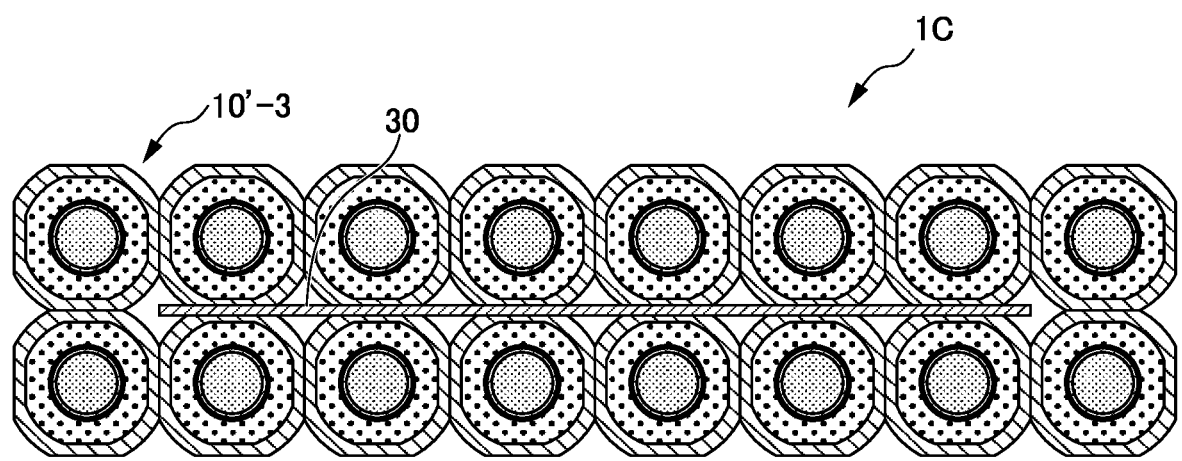
FIG. 6 is a schematic diagram illustrating a cross section of a compound superconducting twisted wire according to another embodiment of the present invention, showing a state of a cross section of the twisted wire after compression with a cross section compression ratio of 12%, with a metal tape being disposed between the compound superconducting strands (Example 3)

Further, when the compound superconducting twisted wire has a substantially rectangular cross section shape, it is preferable to further include a metal tape 30 between compound superconducting strands 10'-3, 10'-3 constituting a compound superconducting twisted wire 1C as shown in FIG. 6, in order to prevent thermal fusion between the compound superconducting strands. Thereby, it is possible to effectively prevent the respective strands 10'-3, 10'-3 on both sides of the metal tape from fusing with each other.

A material of the metal tape 30 may be a heat-resistant metal, and it is preferable to use, for example, stainless steel such as SUS304 or SUS316L. The thickness of the metal tape 30 may be, for example, about 0.02 to 0.10 mm. It should be noted that although FIG. 4 (b) shows an embodiment in which two tiers each including a plurality of compound superconducting strands 10'-1 are stacked, three tiers or more may be stacked to form a rectangular Rutherford twisted wire. In this case, the metal tape can be disposed between neighboring tiers.

Furthermore, the compound superconducting twisted wire (twisted structure) preferably has cross section compression ratio of 5% or more and 20% or less. Thereby, it is possible to more densely dispose the strands constituting the twisted wire, and to reduce the entire size of the twisted wire by reducing the external dimensions of the twisted wire, as well as to increase current density of the twisted wire. Furthermore, in a magnet (superconducting coil) formed of the twisted wire, the twisted wire becomes highly dense, and therefore, the respective strands do not easily move. Therefore, occurrence of quench from a superconductive state due to heat generation from the strands caused by disturbance can be suppressed, resulting in improvement in the superconductive property.

Figure 5:
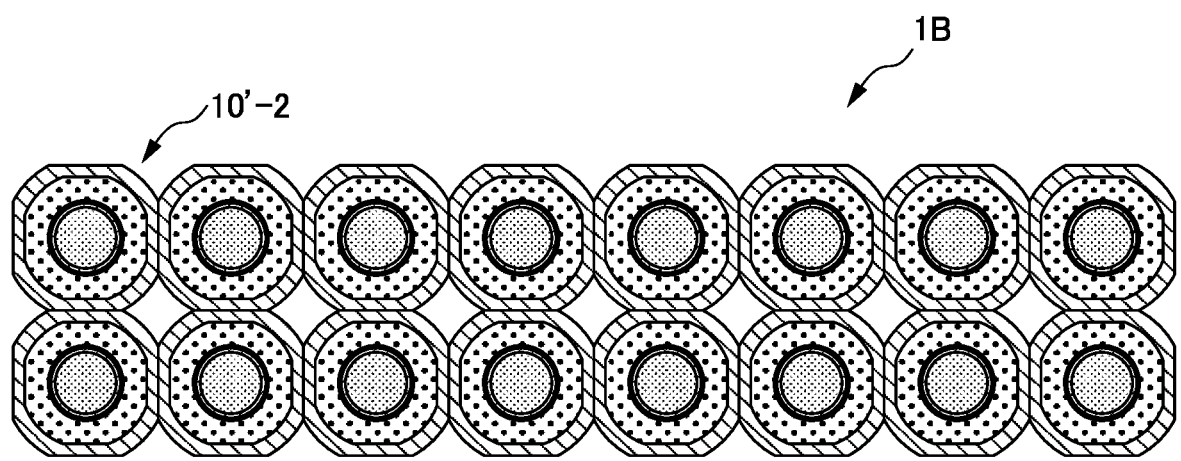
FIG. 5 is a schematic diagram illustrating a cross section of a compound superconducting twisted wire according to another embodiment of the present invention, showing a state of a cross section of the twisted wire after compression with a cross section compression ratio of 12% (Example 2)

FIGS. 4 to 6 are schematical drawings of the cross-sectional state of the compound superconducting twisted wires after compressing by varying the cross section compression ratios. FIG. 4 (a) is a drawing illustrating a cross-sectional state of the twisted wire before compression, FIG. 4 (b) is a drawing illustrating a cross-sectional state of the twisted wire after compression at a cross section compression ratio of 6%, FIG. 5 is a drawing illustrating a cross-sectional state of the twisted wire after compression at a cross section compression ratio of 12%, and FIG. 6 is a drawing illustrating a cross-sectional state of the twisted wire after compression at a cross section compression ratio of 12% while disposing the metal tape 30 between the compound superconducting strands 10'-3, 10'-3.

It should be noted that, for example, when the compound superconducting twisted wire is a Rutherford twisted wire having a substantially rectangular cross section shape, the "cross section compression ratio" refers to a cross section compression ratio in the thickness direction. Specifically, for the twisted structure as shown in FIG. 4(b) in which n tiers each including a plurality of compound superconducting strands arranged in parallel are stacked, given that the diameter of the strand is d (mm) and the thickness of the compound superconducting twisted wire after compression is t (mm), the cross section compression ratio P is represented by the following equation.

$$P(\%)=1-\{t/(n \times d)\} \times 100$$

It should be noted that some of the Rutherford twisted wires have a keystone angle (cross section is wedge-shaped, having a thick edge and a thin edge). In that case, a cross section compression ratio of a median value in the width direction shall be used (by using an average value of a thickness of the thick edge and a thickness of the thin edge as the thickness t).

When the compound superconducting twisted wire is a round-shaped twisted wire, the cross section compression ratio P is expressed by the following equation, in which $t_1$ (mm) after the compression is a total thickness of two neighboring strands which have been subject to the largest compression deformation in the cross section.

$$P(\%)=1-\{t_1/(2 \times d)\} \times 100$$

[Method for Producing Compound Superconducting Twisted Wire]

Figure 7:
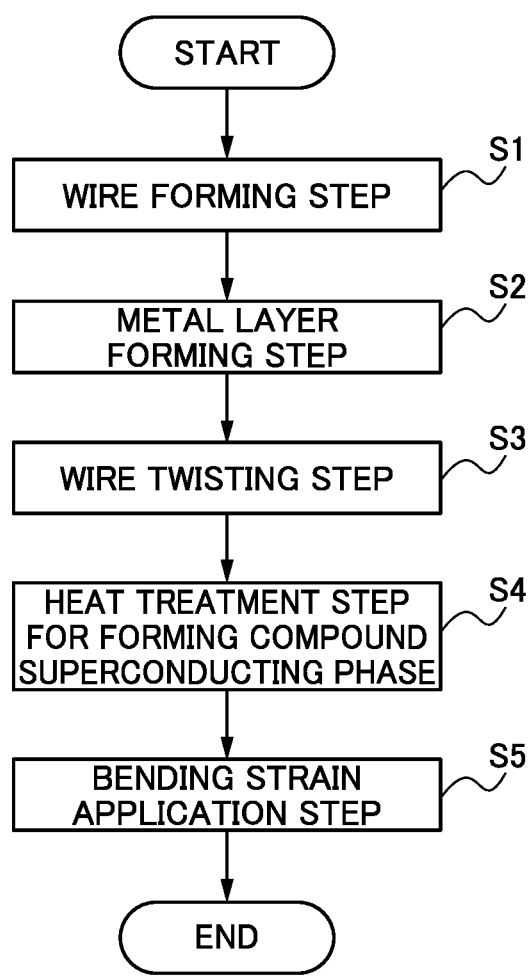
FIG. 7 is a typical process flow chart for explaining a production method of the compound superconducting twisted wire according to an embodiment of the present invention.

Subsequently, a method for producing the compound superconducting twisted wire 1 of the present embodiment is described below. FIG. 7 is a flow chart showing steps of the production method of the compound superconducting twisted wire of the present embodiment. The method for producing the compound superconducting twisted wire in the embodiment shown in FIG. 7 mainly includes a wire forming step S1, a metal layer forming step S2, a wire twisting step S3, a heat treatment step S4 to form the compound superconducting phase, and a bending strain application step S5.

By the method for producing the compound superconducting twisted wire of the present embodiment, it is possible to produce coils by the react-and-wind process. Depending upon the cross-sectional structure of the strand, the internal strain of the compound superconductor part 11 is controlled through a series of manufacturing steps S1 to S5 described above, and the wire is less likely to be damaged during the manufacturing. Further, since a method of use with regard to the winding direction when performing winding of a magnet has been clarified, it is possible to obtain excellent electrical conduction characteristics during operation of the produced magnet. Thus, it is possible to design a magnet at a proper operation safety factor, resulting in reduction of a wire cost. Hereinafter, the respective steps are described below.

(Wire Forming Step)

The wire forming step S1 is a step which includes: providing a compound superconducting precursor part including a plurality of Nb filaments and a matrix including a Cu—Sn base alloy in which these Nb filaments are embedded; sequentially arranging on the outer circumferential side of the compound superconducting precursor part, an Sn diffusion prevention part 14, a reinforcing part 12, and a stabilizing part 13 to form a billet; extruding the billet; and then performing wire drawing to form a wire which is a compound superconducting precursor strand before the heat treatment step S4 for forming a compound superconducting phase. As the wire forming step S1, for example, when the compound superconducting phase includes $Nb_3Sn$, a known wire forming step for producing an $Nb_3Sn$ wire such as the bronze process, an internal tin (Sn) diffusion method, or a powder in tube (PIT) method can be applied.

(Metal Layer Forming Step)

The metal layer forming step S2 is a step of forming a metal layer having a thickness of 2 or less on the surface of a compound superconducting precursor strand to prevent thermal fusion between the compound superconducting precursor strands. This step may be omitted when the volume ratio of the reinforcing part relative to the compound superconducting strand is larger than the volume ratio of the compound superconductor part relative to the compound superconducting strand. For example, a Cr plate layer as a metal layer can be formed on the surface of the compound superconducting precursor strand by an electroplating method in which cathode current is conducted through the compound superconducting precursor strand immersed in a chromium plating solution.

(Wire Twisting Step)

The wire twisting step S3 is a step of twisting a plurality of compound superconducting precursor strands together to produce the compound superconducting precursor twisted wire. Specifically, the wire twisting step S3 may be performed after twisting, the wire twisting step S3 including molding processing, such as rolling using a molding roll apparatus, to a predetermined shape such as a Rutherford cable.

(Heat Treatment Step)

The heat treatment step S4 is a heat treatment step for forming a compound superconducting phase. After performing the heat treatment in the heat treatment step S4, when the temperature is lowered from the heat treatment temperature (e.g., 670° C., 96 hours) to room temperature (e.g., 25° C.), compressive stress (compressive strain) remains in the $Nb_3Sn$ filaments constituting the compound superconductor part 11 and the Sn diffusion prevention part 14 including Ta, Nb, etc., due to difference in the thermal expansion coefficient of members constituting the wire. Further, tensile stress (tensile strain) remains in the first stabilizing material (Cu—Sn base alloy material) of the first matrix constituting the compound superconductor part 11, the second stabilizing material constituting the reinforcing part 12, and the third stabilizing material constituting the stabilizing part 13. Under such a state, when a twisted wire is further stretched or bent at room temperature, the reinforcing part 12 can serve as a member to be subject to tension within the cross section of the wire. Therefore, the $Nb_3Sn$ filaments are less likely to be damaged. Further, by selecting the magnitude of repeated bending strains depending upon the cross-sectional structure of the compound superconducting wire, it is possible to increase the strength in the reinforcing part 12 and relax the compressive stress of a group of $Nb_3Sn$ filaments, resulting in improvement in the superconductive performance under the use environment of the magnet. If the heat treatment is performed while a compound superconducting precursor twisted wire is wound around a winding member such as a heat treatment bobbin, an $Nb_3Sn$ filament is formed in a shape based on its winding diameter Dh.

(Bending Strain Application Step)

The bending strain application step S5 is a step in which bending procession is applied to the superconducting twisted wire W obtained in the heat treatment step S4, to add a predetermined bending strain. In a bending strain application apparatus (not shown), the superconducting twisted wire wound around a heat treatment bobbin is linearly wound off without making the superconducting twisted wire rotate in the axial direction thereof, and then the superconducting twisted wire W is made to pass the two or more pulleys while applying an appropriate bending strain to the superconducting twisted wire W.

Figure 8:
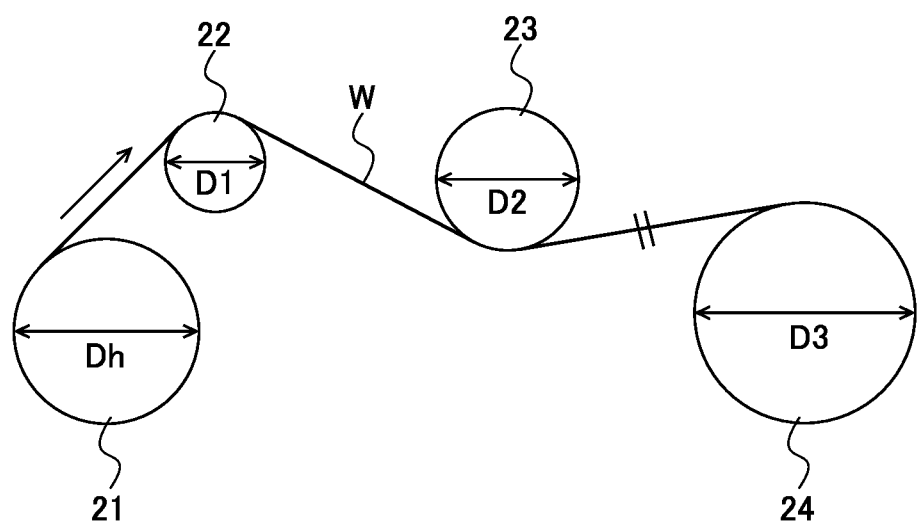
FIG. 8 is a drawing for explaining a bending diameter in the rewinding method of the compound superconducting twisted wire according to an embodiment of the present invention.

As shown in FIG. 8, when the superconducting twisted wire W which is wound around the heat treatment bobbin 21 in an arc shape is wound off without making the superconducting twisted wire W to rotate axially and is linearly bent so as to be deformed, the superconducting twisted wire W is subject to bending strain $\varepsilon_{fb\text{-}straight}$ indicated in the following equation (1) due to a curved linear state. However, the reference dimension shall be the diameter $d_{fb}$ of the compound superconductor part (not including the Sn diffusion prevention part). It should be noted that each of the plurality of compound superconducting strands constituting the compound superconducting twisted wire of the present invention can move independently, and therefore the neutral line of bending strain was assumed to be at the center position of the compound superconductor part 11 constituted by the respective strands. When the diameter $d_{fb}$ of the compound superconductor part (group of filaments) is replaced with the diameter d of a strand, a bending strain based on the strand surface can be obtained.

[Mathematical Formula 1]

$$\varepsilon_{fb\text{-}straight} = \pm d_{fb}\left(-\frac{1}{D_h + d}\right) \cong \mp d_{fb}\left(\frac{1}{D_h}\right) \quad (1)$$

Thereafter, when the compound superconducting twisted wire W is wound around a positive direction bending pulley 22 with a diameter of D1, which is arranged in the same direction (positive direction) as when it was wound around the heat treatment bobbin 21, the compound superconducting twisted wire W is subject to positive direction bending strain $\varepsilon_{fb\text{-}positive}$ indicated in the following formula (2). More particularly, the outer side portion of the surface of the compound superconductor part 11 is subject to tensile strain, and the inner side portion of the surface of the compound superconductor part 11 is subject to compressive strain in the direction opposite to the direction in which the outer side portion of the surface is subject to the tensile strain.

[Mathematical Formula 2]

$$\varepsilon_{fb\text{-}positive} = \pm d_{fb}\left(\frac{1}{D_1 + d} - \frac{1}{D_h + d}\right) \cong \pm d_{fb}\left(\frac{1}{D_1} - \frac{1}{D_h}\right) \quad (2)$$

On the other hand, when the compound superconducting twisted wire W is wound around a reverse direction bending pulley 23 with a diameter of D2, which is arranged in the opposite direction (reverse direction) as when it was wound around the heat treatment bobbin 21, the compound superconducting twisted wire W is subject to reverse direction bending strain $\varepsilon_{fb\text{-}negative}$ indicated in the following formula (3). More specifically, the outer side portion of the surface of the compound superconductor part 11 is subject to compressive strain, and the inner side portion of the surface of the compound superconductor part 11 is subject to tensile strain in the direction opposite to the direction in which the outer side portion of the surface is subject to the compressive strain.

[Mathematical Formula 3]

$$\varepsilon_{fb\text{-}negative} = \pm d_{fb}\left(-\frac{1}{D_2 + d} - \frac{1}{D_h + d}\right) \cong \mp d_{fb}\left(\frac{1}{D_2} + \frac{1}{D_h}\right) \quad (3)$$

The maximum strain applied to the compound superconductor part (group of filaments) 11 is equal to the sum of the maximum tensile bending strain due to the bending diameter and the tensile strain by tension in the axial direction which are applied during wire winding. That is, it is necessary for the maximum strain applied to the compound superconductor part 11 to not exceed the maximum strain under which damage does not occur to the compound superconducting filament 15. As indicated by the formula (3), it is important to control the maximum strain applied when the wire is bent to the reverse direction with respect to the bending direction during the heat treatment.

Further, the compound superconducting twisted wire 1 may be covered by winding an insulating tape on an outer circumferential surface of the twisted wire, after the wire twisting step or later in which the twisted wire has been formed. From the viewpoint of making the insulation tape not easily damaged, it is preferable to coat by winding the insulating tape after the heat treatment step for forming the compound superconducting phase or after the bending strain application step.

[Method for Rewinding Compound Superconducting Twisted Wire]

In the method for rewinding the compound superconducting twisted wire according to the present invention, as shown in FIG. 8, when the compound superconducting twisted wire W is rewound from a first winding member, e.g., the heat treatment bobbin 21, to a second winding member, e.g., a winding-up bobbin 24 for forming, for example, a superconducting coil, via a positive direction bending pulley 22 and a reverse direction bending pulley 23, it is preferred that the compound superconducting twisted wire W is wound off (unwound) from the heat treatment bobbin 21 in the tangential direction of the heat treatment bobbin 21 and wound up around the winding-up bobbin 24 while bending the compound superconducting twisted wire W in the same direction as the direction in which the compound superconducting twisted wire W has been wound around the heat treatment bobbin 21.

Other Embodiments

It should be noted that the embodiments described above are exemplified to facilitate understanding of specific embodiments of the present invention and the present invention is not limited to these embodiments. The present invention should be widely construed, without violating the spirit and range of the invention disclosed in the claims. The explanation above is given focusing on the strand structure constituting the compound superconducting twisted wire, and the compound superconducting strand with a round cross section has a diameter of d and the compound superconductor part (group of superconducting filaments) has a diameter of $d_{fb}$ in the strand structure. However, with respect to the effects of the present invention, similar effects can be obtained even when the cross section of the compound superconducting strand is rectangular, etc. When the cross section has a rectangular shape with a thickness of $d^t$ and a width of $d^w$, as the thickness dimension of the group of superconducting filaments $d_{fb}^t$ and the width dimension $d_{fb}^w$, values of d and $d_{fb}$ in the case of a round wire are replaced with $d^t$ and $d_{fb}^t$ when the wire is bent in a flatwise direction and are replaced with $d^w$ and $d_{fb}^w$ when the wire is bent in an edgewise direction.

<Use of Compound Superconducting Twisted Wire>

The compound superconducting twisted wire 1 of the present invention is preferably used for magnets for generating high magnetic field, semiconductor manufacturing apparatus, medical particle accelerators, magnets for scientific research, etc.

Furthermore, it is possible to increase current-carrying capacity of the compound superconducting twisted wire 1 of the present invention, by using strands having a larger diameter or by increasing the number of twisted strands, in order to obtain an appropriate twisted wire depending upon the superconducting application apparatus. It is also possible to reduce an allowable bending diameter during twisting and winding, by reducing the diameter of the strand, and thereby, it is possible to obtain an appropriate twisted wire depending upon the superconducting application apparatus. The diameter of the compound superconducting strand 10 is preferably in the range of 0.2 mm or more and 2.0 mm or less. When the diameter of the strand is larger than 2.0 mm, flexibility is deteriorated, and thus the handling property tends to be poor. Further, when the diameter of the strand is smaller than 0.2 mm, the strength of the compound superconducting strand 10 itself is weakened, and the handling property tends to be poor.

EXAMPLES

Below, the present invention is further described in detail based on the Examples, but the present invention is not limited only to these Examples.

Example 1A

An Nb filament, which is a precursor of a compound superconducting filament before heat treatment, was embedded in a first matrix precursor, which was before being subjected to heat treatment and which consisted of Cu-14 mass % Sn-0.2 mass % Ti. A plurality of the above was bundled and twisted to form a compound superconducting precursor part. Additionally, an Sn diffusion prevention part consisting of Ta was disposed around the outer circumference of the compound superconducting precursor part, a reinforcing part consisting of Cu-20 volume % Nb was disposed around the outer circumference thereof, and a stabilizing part consisting of oxygen free copper was further disposed around the outer circumference thereof to prepare an $Nb_3Sn$ superconducting precursor strand having a cross sectional structure with a diameter of 0.80 mm, as illustrated in FIG. 1. The compound superconducting precursor part, the Sn diffusion prevention part, the reinforcing part, and the stabilizing part, which constitute the $Nb_3Sn$ superconducting precursor strand, had a volume ratio of 21%, 4%, 60%, and 15%, respectively. The volume ratio of the reinforcing filament (Nb) relative to the reinforcing part was set to 20%. Thereafter, 16 $Nb_3Sn$ superconducting precursor strands were twisted together, followed by compression at a cross section compression ratio of 6% in the thickness direction, to produce the $Nb_3Sn$ superconducting precursor twisted wire having a rectangular cross section shape. At this time, the twisted wire was adjusted to have a conductor width of 6.45 mm and a twist pitch of 65 mm. Next, a heat treatment for forming a compound superconducting phase was performed at 670° C. for 96 hours, and a bending strain was applied to produce the compound superconducting twisted wire. Bending strain application conditions are indicated below.

<Bending Strain Application Conditions>
Diameter Dh of the heat treatment bobbin 21: 500 mm
Diameter D1 of the positive direction bending pulley 22: 125
Diameter D2 of the reverse direction bending pulley 23: 250
Positive direction bending strain $\varepsilon_{fb\text{-}positive}$ of the compound superconductor part 11: 0.22%
Reverse direction bending strain $\varepsilon_{fb\text{-}negative}$ of the compound superconductor part 11: −0.22%
Number of times bent in the bending strain application step: 10 times or more Example 1B A compound superconducting twisted wire having the same configuration as Example 1A was prepared, except that the strand had a cross-sectional structure shown in FIG. 2; the compound superconducting precursor part, the Sn diffusion prevention part, the reinforcing part, and the stabilizing part, which constitute the $Nb_3Sn$ superconducting precursor strand, had a volume ratio of 41%, 4%, 35%, and 20%, respectively; and a Cr plate layer with a thickness of 0.5 μm is formed on the surface of the stabilizing part 13 of the strand.

Example 1C

A compound superconducting twisted wire having the same configuration as Example 1A was prepared, except that the strand had a cross-sectional structure shown in FIG. 3; the compound superconducting precursor part, the Sn diffusion prevention part, the reinforcing part, and the stabilizing part, which constitute the $Nb_3Sn$ superconducting precursor strand, had a volume ratio of 22%, 8%, 50%, and 20%, respectively; the Sn diffusion prevention part included two layers of Ta layer and Nb layer; and the volume ratio of the reinforcing filament (Nb) relative to the reinforcing part was 30%.

Comparative Example 1

A compound superconducting twisted wire having the same configuration as Example 1A was prepared, except that the compound superconducting precursor part, the Sn diffusion prevention part, the reinforcing part, and the stabilizing part, which constitute the $Nb_3Sn$ superconducting precursor strand, had a volume ratio of 41%, 4%, 35%, and 20%, respectively.

Example 2A

A compound superconducting twisted wire having the same configuration as Example 1A was produced, except that the cross section compression ratio after twisting was 12%.

Example 2B

A compound superconducting twisted wire having the same configuration as Example 1B was produced, except that the cross section compression ratio after twisting was 12%.

Example 2C

A compound superconducting twisted wire having the same configuration as Example 1C was produced, except that the cross section compression ratio after twisting was 12%.

Comparative Example 2

A compound superconducting twisted wire having the same configuration as Comparative Example 1 was produced, except that the cross section compression ratio after twisting was 12%.

Example 3

A compound superconducting twisted wire having the same configuration as Example 2A was produced, except that a metal tape including SUS316L with a thickness of 0.08 mm was disposed between the compound superconducting strands.

Comparative Example 3A

A compound superconducting twisted wire having the same configuration as Example 3 was produced, except that the compound superconducting precursor part, the Sn diffusion prevention part, the reinforcing part, and the stabilizing part, which constitute the $Nb_3Sn$ superconducting precursor strand, had a volume ratio of 41%, 4%, 35%, and 20%, respectively.

Comparative Example 3B

A compound superconducting twisted wire having the same configuration as Example 3 was produced, except that the compound superconducting precursor part, the Sn diffusion prevention part, the reinforcing part, and the stabilizing part, which constitute the $Nb_3Sn$ superconducting precursor strand, had a volume ratio of 41%, 4%, 35%, and 20%, respectively, and the bending strain application step was not performed.

(Evaluation Method)

Below, methods of tests and evaluations are described in detail.

(1) Measurement of Strength During Tension (0.2% Proof Stress) of Compound Superconducting Strand 0.2% proof stress of the compound superconducting strand was measured in accordance with JIS H 7303, using a tensile testing machine (Shimadzu Corporation Autograph AG-10TD) at room temperature (25° C.), after the $Nb_3Sn$ superconducting formation heat treatment at 670° C. for 96 hours. The measurement results are shown in Table 1. In the Examples, a strand having strength under tension (0.2% proof stress) of 250 MPa or more was evaluated to be at a level with no problem in practical use.

(2) Evaluation of Non-Adhesiveness (or Easiness of Separation after Adhesion) of Strands Constituting Compound Superconducting Twisted Wire Non-adhesiveness (or easiness of separation after adhesion) of the strands constituting the compound superconducting twisted wire after the $Nb_3Sn$ superconducting formation heat treatment at 670° C. for 96 hours was evaluated in four grades by the following test, in which a reciprocating bending strain of ±0.5% was applied to a surface of a sample strands cut to a length three times longer than the twist pitch and visually inspecting whether or not the strands are adhered to each other or separated (peeled off) from each other. That is, before application of the bending strain, when the adhesion between the strands was not observed and the strands were separated from each other, the strands were rated as "1"; when the adhesion between the strands was recognized but the adhesion was unlikely to have an adverse effect during application of the bending strain, the strands were rated as "2"; when the adhesion between the strands was recognized and the adhesion was likely to have an adverse effect during application of the bending strain, the strands were rated as "3"; and when the adhesion between the strands was observed and the adhesion was obviously likely to have an adverse effect during application of the bending strain, the strands were rated as "4". In the Examples, the strands having non-adhesiveness evaluation results of "1" and "2" were determined to be at a level with no problem in practical use.

TABLE 1-1

| Item | | | | Symbol | Unit | Example 1A | Example 1B | Example 1C | Comparative Example 1 |
|---|---|---|---|---|---|---|---|---|---|
| Compound super-conducting twisted wire | Compound super-conducting strand | Cross-sectional structure of strand | | — | — | FIG. 1 | FIG. 2 | FIG. 3 | FIG. 1 |
| | | Strand diameter | | d | mm | 0.80 | 0.80 | 0.80 | 0.80 |
| | | Compound super-conducting wire | Type | — | — | $Nb_3Sn$ filament and Cu—Sn matrix | $Nb_3Sn$ filament and Cu—Sn matrix | $Nb_3Sn$ filament and Cu—Sn matrix | $Nb_3Sn$ filament and Cu—Sn matrix |
| | | | Diameter of compound superconductor part | dfb | mm | 0.37 | 0.51 | 0.38 | 0.51 |
| | | | Volume ratio of compound superconductor part (Relative to compound superconducting wire) | V1 | % | 21 | 41 | 22 | 41 |
| | | Reinforcing part | Type | — | — | Cu—Nb | Cu—Nb | Cu—Nb | Cu—Nb |
| | | | Volume ratio V2 of reinforcing part (Relative to compound superconducting strand) | V2 | % | 60 | 35 | 50 | 35 |
| | | | Volume ratio of reinforcing filament (Nb) (Relative to reinforcing part) | V21 | % | 20 | 20 | 30 | 20 |

TABLE 1-1-continued

| | | Item | Symbol | Unit | | | | |
|---|---|---|---|---|---|---|---|---|
| | | Volume ratio of reinforcing filament (Nb) (Relative to compound superconducting strand) | $V2 \cdot V21/100$ | % | 12 | 7 | 15 | 7 |
| | | Volume ratio of second stabilizing material (Cu) (Relative to reinforcing part) | V22 | % | 80 | 80 | 70 | 80 |
| | Sn diffusion prevention part | Type | — | — | Ta | Ta | Ta/Nb | Ta |
| | | Volume ratio of Sn diffusion prevention part (Relative to compound superconducting strand) | V3 | % | 4 | 4 | 8 | 4 |
| | Total volume ratio of reinforcing filament and Sn diffusion prevention part (Relative to compound superconducting strand) | | $V5$ $(=V2 \cdot V21/100 + V3)$ | % | 16 | 11 | 23 | 11 |
| | Stabilizing part | Type | — | — | Oxygen free Cu | Oxygen free Cu | Oxygen free Cu | Oxygen free Cu |
| | | Volume ratio of stabilizing part (third stabilizing material) (Relative to compound superconducting strand) | V4 | % | 15 | 20 | 20 | 20 |
| | | Total volume ratio of second and third stabilizing materials (Relative to compound superconducting strand) | $V6$ $(=V2 \cdot V22/100 + V4)$ | % | 63 | 48 | 55 | 48 |
| | Metal layer | Type | — | — | None | Chromium plating | None | None |
| | | Thickness | — | μm | — | 0.5 | — | — |
| Twisted wire structure | Presence or absence of metal tape | | — | — | Absent | Absent | Absent | Absent |
| | Compression ratio | | — | % | 6.0 | 6.0 | 6.0 | 6.0 |
| Presence or absence of bending strain application step | | | — | — | Present | Present | Present | Present |
| Evaluation | 0.2% proof stress of strand under tension | | — | MPa | 290 | 250 | 310 | 250 |
| | Non-adhesiveness of strands constituting twisted wire | | — | — | 2 | 1 | 2 | 3 |

| | | Item | Symbol | Unit | Example 2A | Example 2B |
|---|---|---|---|---|---|---|
| Compound superconducting twisted wire | Compound superconducting strand | Cross-sectional structure of strand | — | — | FIG. 1 | FIG. 2 |
| | | Strand diameter | d | mm | 0.80 | 0.80 |
| | | Compound superconducting wire Type | — | — | $Nb_3Sn$ filament and Cu—Sn matrix | $Nb_3Sn$ filament and Cu—Sn matrix |
| | | Diameter of compound superconductor part | dfb | mm | 0.37 | 0.51 |
| | | Volume ratio of compound superconductor part (Relative to compound superconducting wire) | V1 | % | 21 | 41 |

TABLE 1-1-continued

| | | | | | | | |
|---|---|---|---|---|---|---|---|
| | | Reinforcing part | Type | — | — | Cu—Nb | Cu—Nb |
| | | | Volume ratio V2 of reinforcing part (Relative to compound superconducting strand) | V2 | % | 60 | 35 |
| | | | Volume ratio of reinforcing filament (Nb) (Relative to reinforcing part) | V21 | % | 20 | 20 |
| | | | Volume ratio of reinforcing filament (Nb) (Relative to compound superconducting strand) | V2 · V21/ 100 | % | 12 | 7 |
| | | | Volume ratio of second stabilizing material (Cu) (Relative to reinforcing part) | V22 | % | 80 | 80 |
| | | Sn diffusion prevention part | Type | — | — | Ta | Ta |
| | | | Volume ratio of Sn diffusion prevention part (Relative to compound superconducting strand) | V3 | % | 4 | 4 |
| | | Total volume ratio of reinforcing filament and Sn diffusion prevention part (Relative to compound superconducting strand) | | V5 (=V2 · V21/ 100 + V3) | % | 16 | 11 |
| | | Stabilizing part | Type | — | — | Oxygen free Cu | Oxygen free Cu |
| | | | Volume ratio of stabilizing part (third stabilizing material) (Relative to compound superconducting strand) | V4 | % | 15 | 20 |
| | | | Total volume ratio of second and third stabilizing materials (Relative to compound superconducting strand) | V6 (=V2 · V22/ 100 + V4) | % | 63 | 48 |
| | | Metal layer | Type | — | — | None | Chromium plating |
| | | | Thickness | — | μm | — | 0.5 |
| | Twisted wire structure | Presence or absence of metal tape | | — | — | Absent | Absent |
| | | Compression ratio | | — | % | 12.0 | 12.0 |
| | Presence or absence of bending strain application step | | | — | — | Present | Present |
| Evaluation | 0.2% proof stress of strand under tension | | | — | MPa | 290 | 250 |
| | Non-adhesiveness of strands constituting twisted wire | | | — | — | 2 | 1 |

TABLE 1-2

| Item | | | Symbol | Unit | Example 2C | Comparative Example 2 | Example 3 | Comparative Example 3A | Comparative Example 3B |
|---|---|---|---|---|---|---|---|---|---|
| Compound superconducting twisted wire | Compound superconducting strand | Cross-sectional structure of strand | — | — | FIG. 3 | FIG. 1 | FIG. 1 | FIG. 1 | FIG. 1 |
| | | Strand diameter | d | mm | 0.80 | 0.80 | 0.80 | 0.80 | 0.80 |
| | | Compound superconducting wire — Type | — | — | $Nb_3Sn$ filament and Cu—Sn matrix | $Nb_3Sn$ filament and Cu—Sn matrix | $Nb_3Sn$ filament and Cu—Sn matrix | $Nb_3Sn$ filament and Cu—Sn matrix | $Nb_3Sn$ filament and Cu—Sn matrix |
| | | Diameter of compound superconductor part | dfb | mm | 0.38 | 0.51 | 0.37 | 0.51 | 0.51 |
| | | Volume ratio of compound superconductor part (Relative to compound superconducting wire) | V1 | % | 22 | 41 | 21 | 41 | 41 |
| | | Reinforcing part — Type | — | — | Cu—Nb | Cu—Nb | Cu—Nb | Cu—Nb | Cu—Nb |
| | | Volume ratio V2 of reinforcing part (Relative to compound superconducting strand) | V2 | % | 50 | 35 | 60 | 35 | 35 |
| | | Volume ratio of reinforcing filament (Nb) (Relative to reinforcing part) | V21 | % | 30 | 20 | 20 | 20 | 20 |
| | | Volume ratio of reinforcing filament (Nb) (Relative to compound superconducting strand) | V2·V21/100 | % | 15 | 7 | 12 | 7 | 7 |
| | | Volume ratio of second stabilizing material (Cu) (Relative to reinforcing part) | V22 | % | 70 | 80 | 80 | 80 | 80 |
| | | Sn diffusion prevention part — Type | — | — | Ta/Nb | Ta | Ta | Ta | Ta |
| | | Volume ratio of Sn diffusion prevention part (Relative to compound superconducting strand) | V3 | % | 8 | 4 | 4 | 4 | 4 |
| | | Total volume ratio of reinforcing filament and Sn diffusion prevention part (Relative to compound superconducting strand) | V5 (=V2·V21/100 + V3) | % | 23 | 11 | 16 | 11 | 11 |
| | | Stabilizing part — Type | — | — | Oxygen free Cu | Oxygen free Cu | Oxygen free Cu | Oxygen free Cu | Oxygen free Cu |
| | | Volume ratio of stabilizing part (third stabilizing material) (Relative to compound superconducting strand) | V4 | % | 20 | 20 | 15 | 20 | 20 |
| | | Total volume ratio of second and third stabilizing materials Relative to compound superconducting strand | V6 (=V2·V22/100 + V4) | % | 55 | 48 | 63 | 48 | 48 |
| | | Metal layer — Type | — | — | None | None | None | None | None |
| | | Metal layer — Thickness | — | μm | — | — | — | — | — |
| | Twisted wire structure | Presence or absence of metal tape | — | — | Absent | Absent | Present | Present | Present |
| | | Compression ratio | — | % | 12.0 | 12.0 | 12.0 | 12.0 | 12.0 |
| | | Presence or absence of bending strain application step | — | — | Present | Present | Present | Present | Absent |
| Evaluation | | 0.2% proof stress of strand under tension | — | MPa | 310 | 250 | 310 | 250 | 220 |
| | | Non-adhesiveness of strands constituting twisted wire | — | — | 2 | 4 | 2 | 3 | 4 |

From the evaluation results shown in Table 1, all the compound superconducting twisted wires of Examples 1A to 1C, Example 2A to 2C, and Example 3 had a strength under tension (0.2% proof stress) of 250 MPa or more. Evaluation results for the non-adhesiveness of the strands constituting each of the twisted wires were "1" or "2" and all the twisted wires were at a level with no problem in practical use. In addition, after the bending strain application, the compound superconducting strands of which non-adhesiveness was evaluated as "2" had a separated surface portion, that is, a surface scar. In contrast, in each of Comparative Examples 1 to 3, the volume ratio of the reinforcing part relative to the compound superconducting twisted wire was smaller than the volume ratio of the compound superconductor part relative to the compound superconducting twisted wire, and the metal layer was not disposed. The evaluation results for the non-adhesiveness of the strands constituting the twisted wires were "3" or "4", and the twisted wires were at a level in which a problem may arise.

EXPLANATION OF REFERENCE NUMERALS 1, 1A, 1B Compound superconducting twisted wire (after compression) (or rectangular Rutherford twisted wire)
1' Compound superconducting twisted wire (before compression) (or rectangular Rutherford twisted wire)
10, 10A, 10B Compound superconducting strand (before compression)
10"-1, 10"-2, 10"-3 Compound superconducting strand (after compression)
11 Compound superconductor part
12 Reinforcing part
13 Stabilizing part
14, 14a, 14b Sn diffusion prevention layer
15 Compound superconducting filament
16 First matrix
17 Core portion of unreacted Nb
18 Reinforcing filament
19 Second matrix
20 Metal layer
21 Heat treatment bobbin
22 Positive direction bending pulley
23 Reverse direction bending pulley
24 Winding-up member (or winding-up bobbin)
30 Metal tape

The invention claimed is:

1. A compound superconducting twisted wire comprising a plurality of compound superconducting strands being twisted to form a twisted structure,
wherein each of the compound superconducting strands comprises a core-like compound superconductor part, a cylindrical reinforcing part and a cylindrical stabilizing part,
wherein the core-like compound superconductor part comprises a plurality of compound superconducting filaments and a first matrix, the compound superconducting filaments each comprising a compound superconducting phase, the first matrix comprising the plurality of compound superconducting filaments embedded therein and a first stabilizing material,
wherein the cylindrical reinforcing part is disposed on an outer circumferential side of the compound superconductor part, and comprises a plurality of reinforcing filaments and a second matrix, the second matrix comprising the plurality of reinforcing filaments embedded therein and a second stabilizing material,
wherein the cylindrical stabilizing part is disposed on at least one side of an inner circumferential side and an outer circumferential side of the reinforcing part, and comprises a third stabilizing material, and
wherein a volume ratio of the reinforcing part relative to the compound superconducting strand is larger than a volume ratio of the compound superconductor part relative to the compound superconducting strand.

2. The compound superconducting twisted wire according to claim 1,
wherein the volume ratio of the reinforcing part relative to the compound superconducting strand is 40% or more and 65% or less and the volume ratio of the compound superconductor part relative to the compound superconducting strand is 20% or more and 40% or less.

3. The compound superconducting twisted wire according to claim 2,
wherein at least one or all of the plurality of compound superconducting strands have a surface scar generated when the compound superconducting strands have been separated from an adhering surface of other compound superconducting strands.

4. The compound superconducting twisted wire according to claim 2, further comprising an Sn diffusion prevention part between the compound superconductor part and the reinforcing part.

5. The compound superconducting twisted wire according to claim 2,
wherein a total of a volume ratio of the second stabilizing material relative to the compound superconducting strand and a volume ratio of the third stabilizing material relative to the compound superconducting strand is 50% or more.

6. The compound superconducting twisted wire according to claim 2,
wherein a volume ratio of the reinforcing filament relative to the compound superconducting strand is 11% or more and 15% or less.

7. The compound superconducting twisted wire according to claim 2,
wherein the twisted structure has a substantially rectangular cross section shape.

8. The compound superconducting twisted wire according to claim 1,
wherein at least one or all of the plurality of compound superconducting strands have a surface scar generated when the compound superconducting strands have been separated from an adhering surface of other compound superconducting strands.

9. The compound superconducting twisted wire according to claim 1, further comprising an Sn diffusion prevention part between the compound superconductor part and the reinforcing part.

10. The compound superconducting twisted wire according to claim 9, wherein
the compound superconducting phase comprises Nb3Sn,
the first stabilizing material comprises Cu or a Cu alloy,
the Sn diffusion prevention part comprises Nb or Ta, or an alloy or a composite thereof,
the reinforcing filament comprises at least one metal or an alloy of two or more metals selected from the group consisting of Nb, Ta, V, W, Mo, Fe, Ti, Ag, and Hf,
the second stabilizing material comprises Cu or a Cu alloy, and
the third stabilizing material comprises Cu or a Cu alloy.

11. The compound superconducting twisted wire according to claim 9,
wherein a total of a volume ratio of the reinforcing filament relative to the compound superconducting strand and a volume ratio of the Sn diffusion prevention part relative to the compound superconducting strand is 15% or more.

12. The compound superconducting twisted wire according to claim 1,
wherein a total of a volume ratio of the second stabilizing material relative to the compound superconducting strand and a volume ratio of the third stabilizing material relative to the compound superconducting strand is 50% or more.

13. The compound superconducting twisted wire according to claim 1, wherein a volume ratio of the reinforcing filament relative to the compound superconducting strand is 11% or more and 15% or less.

14. The compound superconducting twisted wire according to claim 1, wherein the twisted structure has a substantially rectangular cross section shape.

15. The compound superconducting twisted wire according to claim 14, further comprising a metal tape for preventing thermal fusion between the compound superconducting strands, wherein the metal tape is disposed between the compound superconducting strands constituting the compound superconducting twisted wire.

16. The compound superconducting twisted wire according to claim 15, wherein the twisted structure has a cross section compression ratio of 5% or more and 20% or less.

17. The compound superconducting twisted wire according to claim 14, wherein the twisted structure has a cross section compression ratio of 5% or more and 20% or less.

* * * * *